United States Patent [19]

Wolf et al.

[11] Patent Number: 4,810,346
[45] Date of Patent: Mar. 7, 1989

[54] MAGNETRON TYPE SPUTTERING CATHODE

[75] Inventors: Bernd Wolf, Hanau; Peter Wirz, Waldernbach, both of Fed. Rep. of Germany

[73] Assignee: Leybold Aktiengesellschaft, Hanau I, Fed. Rep. of Germany

[21] Appl. No.: 111,207

[22] Filed: Oct. 21, 1987

[30] Foreign Application Priority Data

Aug. 21, 1987 [DE] Fed. Rep. of Germany ....... 3727901

[51] Int. Cl.$^4$ .............................................. C23C 14/34
[52] U.S. Cl. .................................. 204/298; 204/192.12
[58] Field of Search ........................... 204/298, 192.12

[56] References Cited

U.S. PATENT DOCUMENTS

| 4,401,539 | 8/1983 | Abe et al. | 204/192.13 |
| 4,426,264 | 1/1984 | Münz et al. | 204/192.13 |
| 4,444,635 | 4/1984 | Kobayashi et al. | 204/192.15 |
| 4,601,806 | 7/1986 | Wirz | 204/298 |

FOREIGN PATENT DOCUMENTS

| 2243708 | 4/1973 | Fed. Rep. of Germany | 204/298 |
| 3047113 | 7/1982 | Fed. Rep. of Germany | 204/298 |
| 3442206 | 7/1985 | Fed. Rep. of Germany | 204/298 |
| 59-208072 | 11/1984 | Japan | 204/298 |
| 61-14194 | 1/1986 | Japan | 204/298 |

Primary Examiner—Aaron Weisstuch
Attorney, Agent, or Firm—Felfe & Lynch

[57] ABSTRACT

Sputtering cathode (1) according to the magnetron principle, having a target (11) of the material to be sputtered, which consists of at least one piece. Behind the target (11) there is a magnet system with a plurality of endless magnet units (14, 15, 16) of alternately different polarity, one inside the other. An endless magnetic tunnel (20) of arcuately curved lines of force is thereby formed. Those poles of the magnet units (14, 15, 16) which are turned away from the target (11) are connected together through a magnet yoke (19) of soft magnetic material. To achieve an especially good target utilization, the geometry and the amount of the magnetic field forming a magnetic tunnel (20) are variable relative to the magnetic field strength of another magnetic field through an electromagnetic (17), the current for the electromagnet (17) being variable in frequency, amplitude and pulse shape.

7 Claims, 5 Drawing Sheets

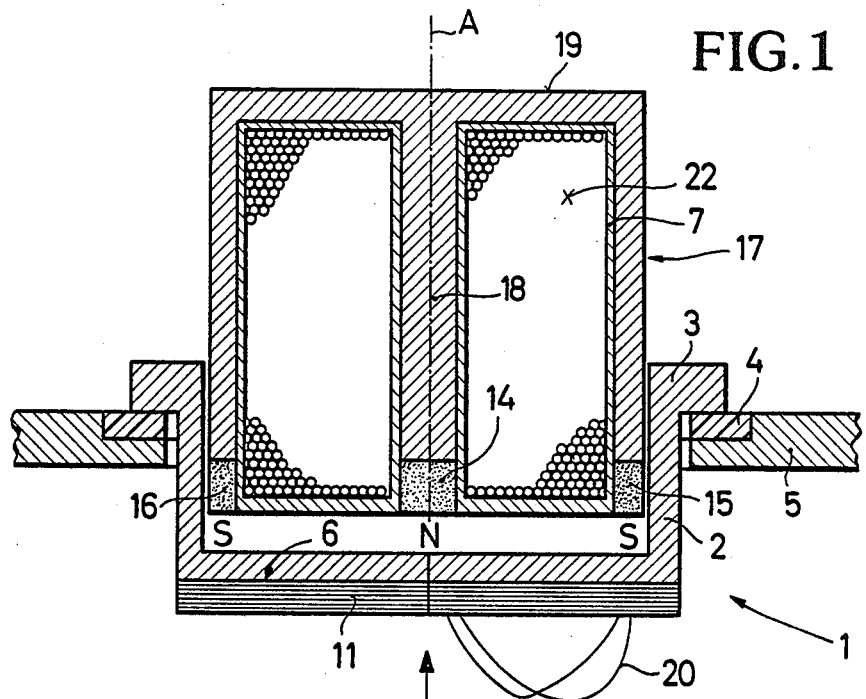
FIG.1
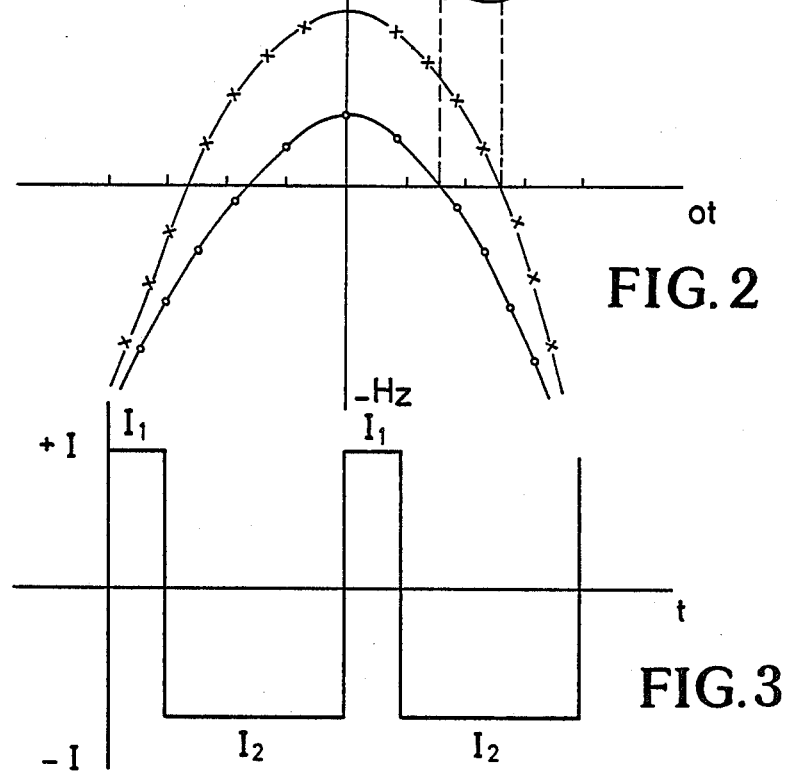
FIG.2
FIG.3

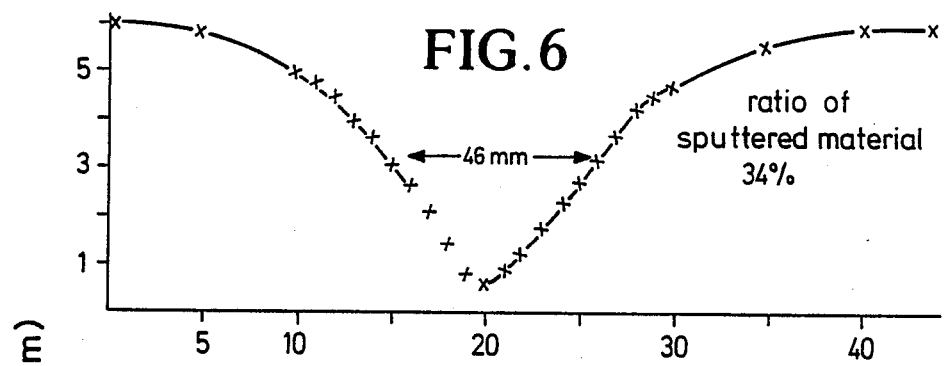
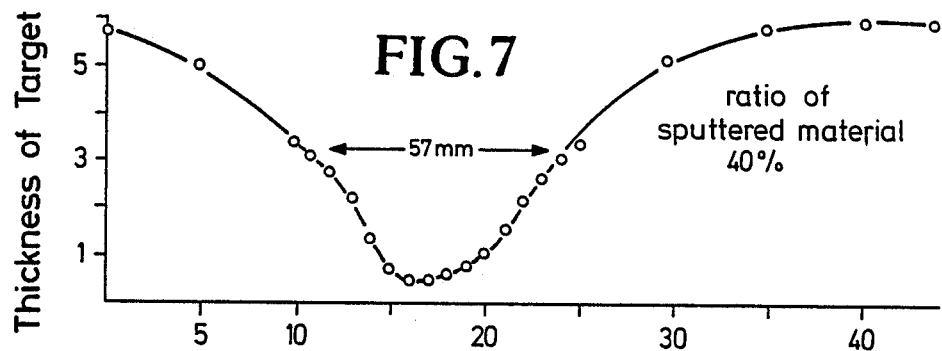
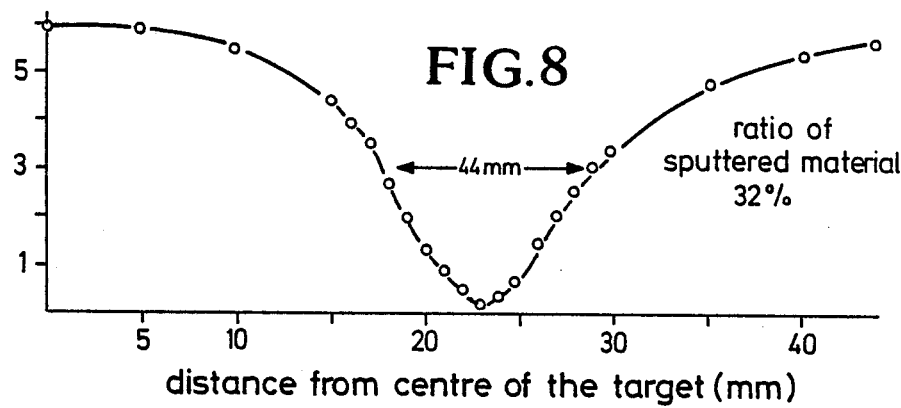

MAGNETRON TYPE SPUTTERING CATHODE

BACKGROUND OF THE INVENTION

The invention relates to a sputtering cathode on the magnetron principle, having a target consisting of at least one piece of the material to be sputtered and having a system of magnet units of alternately different polarity disposed behind the target, by which at least one continuous magnetic tunnel of arcuately curved lines of force is formed, and the magnetic unit poles facing away from the target are joined together by a yoke of soft magnetic material.

German Federal Republic OS No. 34 42 206 (U.S. Pat. No. 4,601,806) discloses a sputtering cathode of the kind described above, which is designed for sputtering targets of ferromagnetic materials. In one of the two embodiments, two magnet units lying concentrically one inside the other form, in conjunction with two concentric air gaps disposed in the target, two endless magnetic tunnels, one inside the other, of arcuately curved lines of force. Since, however, in this case the magnetic fields are magnetically in series with one another across the two air gaps, the field strengths of the two tunnels cannot be controlled independently of one another. Thus, in the area of the two magnetic tunnels, different sputtering rates develop, and in the area of the substrate facing the target greatly different rates of deposition, so that the coating thickness is very irregular.

In the case of bar cathodes German Federal Republic OS No. 22 43 708 discloses the disposal of magnet units axially in tandem in order thereby to make the sputtering of the target material more even. For the planar targets therein described it is also stated that concentric magnetic tunnels situated one inside the other can be provided. In this case too, no possibilities are provided for any separate adjustment of each magnetic tunnel independently of the adjacent tunnel, nor is such adjustment possible.

It is known through a sputtering cathode of the kind described above which is sold under the name "Con Mag" by the Varian company to provide within and at a distance from a circular yoke plate a circular disk-shaped yoke plate, and to associate with each yoke plate two magnet units of opposite polarity acting independently of one another, while a target having a conical sputtering surface is disposed over the circular ring-shaped magnet system and a planar target plate is disposed over the circular disk-shaped magnet system. Means for controlling independently of one another the magnetic field strength of the two tunnels formed are not provided. In this sputtering cathode the sputtering effect must be accepted as determined by the position of the magnetic tunnels relative to the sputtering surfaces.

Now, especially when the target consists of a nonferromagnetic material, the distance of the magnet system or systems from the target has a considerable influence on the distribution of the lines of force over the sputtering surface and hence on the so-called "erosion profile." To compensate the increasing consumption of the target material by the formation of an erosion pit, German Federal Republic OS No. 30 47 113 (U.S. Pat. No. 4,426,264) discloses varying the distance between the magnet system and the back of the target with the advancing consumption of the target material. The magnet system in question, however, consists of only two magnet units which produce a single magnetic tunnel.

Now, the invention is addressed to the problem of devising a sputtering cathode both for magnetic and for nonmagnetic target materials which will result in coatings of very uniform thickness and permit an especially good utilization of the target.

SUMMARY OF THE INVENTION

The solution of the stated problem is accomplished according to the invention, in the sputtering cathode described in the beginning, in that at least one of the permanent magnets is controlled by an electromagnet, while the field distribution is variable according to the power input to the electromagnet.

For this purpose the magnet yoke bearing the permanent magnets is of an annular configuration, the electromagnet having a pot-like yoke which fills the central opening of the magnet yoke or is disposed therein.

In a preferred embodiment the winding of the magnet unit in the form of an electromagnet has a winding core whose end toward the target bears a permanent magnet.

In order to hold the electromagnet winding, through which an alternating current flows, tightly together and provide it with a secure insulation from the magnet yoke, the circularly wound magnet coil disposed in the pot-like yoke of the electromagnet is at least partially surrounded by a body of insulating material.

In an alternative embodiment of the sputtering cathode the magnet yoke bearing the permanent magnets is in the form of an elongated, substantially shell-like component, and the base body holding the target is in the form of a piece of U-shaped cross section, while the winding of the electromagnet is surrounded on the one hand by the shell-like magnet yoke and on the other by the bottom of the base body.

The electromagnet desirably receives input from an amplifier and/or oscillator which supplies the electromagnet with an alternating current whose amplitude, frequency and pulse shape are variable.

Additional advantageous developments of the subject matter of the invention will be found in the subordinate claims.

BRIEF DESCRIPTION OF THE DRAWING

The invention is susceptible of a great variety of embodiments; two of them are shown diagrammatically in the appended drawings, wherein:

FIG. 1 is an axial section through a sputtering cathode having an electromagnet with a hollow cylindrical yoke, FIG. 2 is a graph of the shape of the field of the cycle component at current $I_1$ (x) and current $I_2$ (o) at the electromagnet of FIG. 1, FIG. 3 represents the timing of the coil current in the electromagnet of FIG. 1, FIGS. 6 to 11 represent various erosion profiles from targets of conventional cathodes in comparison to the cathode of FIG. 1.

In FIG. 1 is represented a sputtering cathode 1 whose holder is a pot-like base body 2 which consists of a material (copper) of good thermal conduction on account of the thermal stress, and which is inserted into a wall 5 of a vacuum chamber not indicated in the drawing, where it is held by a circumferential flange 3 with the interposition of an insulator 4.

Figure 4:
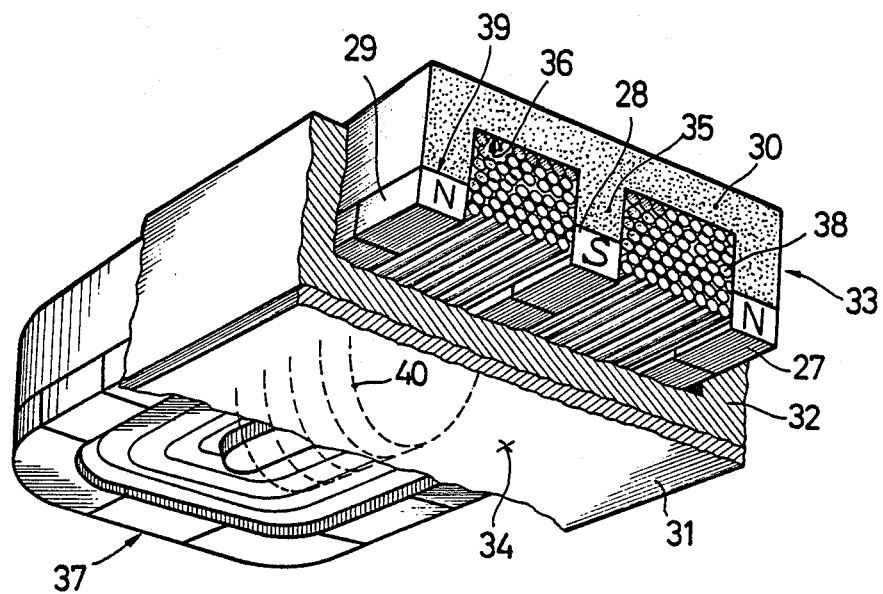
FIG. 4 is a fragmentary perspective view of a sputtering cathode with a box-shaped yoke.
Figure 5:
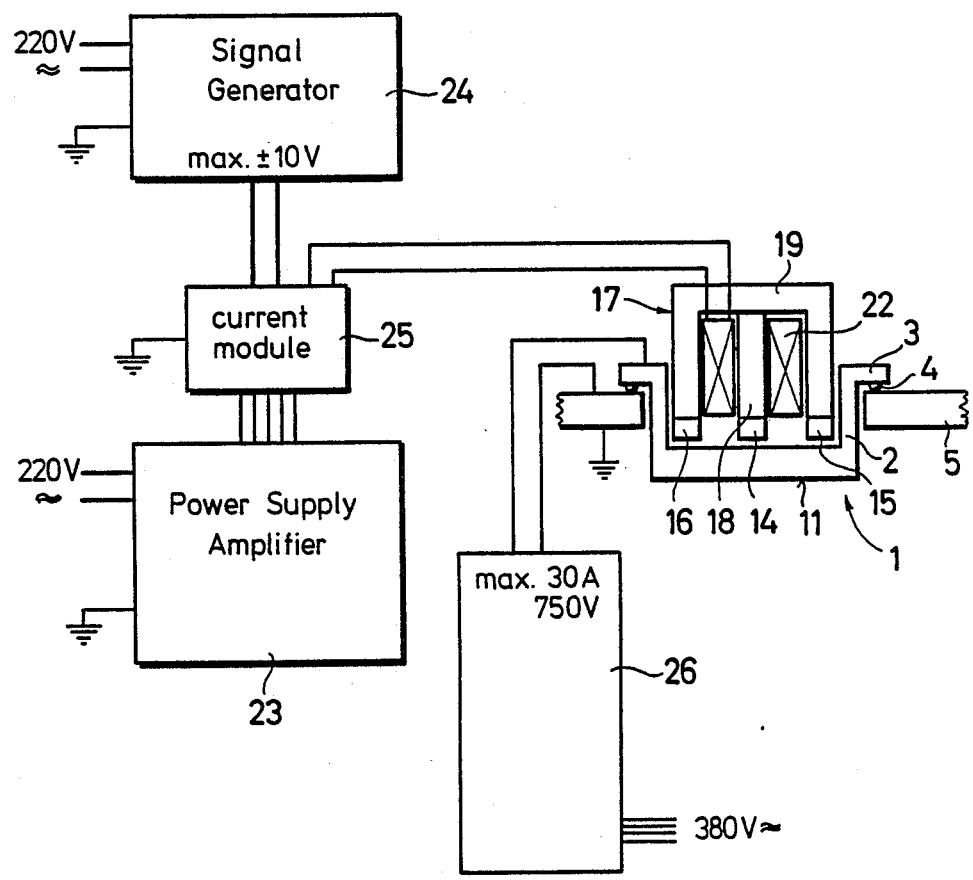
FIG. 5 is a block circuit diagram of the power supply of the sputtering cathode.

The base body 2 has a mostly flat faceplate 6. To the outside of the faceplate is bonded a target 11. In the opening of the base body 2 is a magnet system having a plurality of magnet units 14, 15 and 16 situated one inside the other with respect to the axis A, and all consisting of a permanent magnetic material magnetized in the axial direction. The magnet units 15 and 16 are composed of a number of oblong permanent magnets whose faces of like polarity lie substantially in a circular plane. The fact that such a concatenation of permanent magnets actually results in a polygon is here disregarded. The poles of magnet units 14, 15 and 16 facing away from the target 11 are connected together through a magnet yoke 19 of soft magnetic material in the manner shown in FIG. 1. The magnet yoke 19 consists of an outer yoke portion whose base is an annular surface, and of an inner yoke portion whose base is a circular surface.

The magnet units 14, 15 and 16 are of alternately different polarity: the pole faces facing the target 11 in the case of magnet unit 14 form a north pole, in the case of magnet unit 15 a south pole, and in the case of magnet unit 16 again a south pole. In view of the air gaps present between the magnet units and the target 11, this leads to the formation of a magnetic tunnel 20 whose lines of force are represented in broken lines in the right half of FIG. 1. Actually, the tunnel 20 follows the course of the air gap, i.e., it runs all the way around the axis A.

The yoke 19 is approximately of an inverted pot shape and is provided with a core 18 running centrally from the pot bottom toward the target 11.

In addition to the center magnet unit 14, an electromagnet 17 is also provided, whose coil or winding 22 is disposed in the pot-like yoke of soft magnetic material, and is wound around the core 18.

The special advantage of the represented embodiment of a sputtering cathode 1 consists in the fact that an additional magnetic field, which is produced by the electromagnet 17, is superimposed on the field of the permanent magnets 14, 15 and 16 made of cobalt-samarium or neodymium-iron-boron. This varies the geometry and the strength of the magnetic field on the target surface. This field variation brings about a shift of the plasma ring on the target 11. This shift depends for one thing on the set of permanent magnets 14, 15 and 16 and on the current flowing through the electromagnet 17. In experiments performed, this shift, as represented in FIG. 2, has amounted to between 5 and 8 mm.

The power supply to the electromagnet 17 includes an amplifier 23 which is controlled by an signal generator 24. The nature of the control makes it possible to select the frequency, amplitude and waveform of the current. It has been found that an alternating current which can be represented by rectangles of different length (see FIG. 3) leads to the greatest utilization. The current module 25 is necessary so that the current which the amplifier 23 is to supply will directly follow the control voltage of the signal generator 24. Module 25 is necessary since the amplifier 23 is loaded with the relatively great inductivity of the magnet. Power supply 26 is provided for target 11.

A sputtering cathode is provided in which said electromagnet supplies an electromagnetic field having a frequency set at 0.1 Hz to 10.0 Hz.

The sputtering cathode includes an electromagnet which supplies an electromagnetic field with a change of the electromagnetic field with time being a rectangular function, wherein the ratio of the pulse lengths is selectable between 1:1 and 1:16.

Important to proper operation is a good electrical insulation between the electromagnet 17, which is grounded, and the base body 2 which is at high potential. The functionality of the apparatus is assured only if the insulation 7 is good.

The sputtering cathode represented in FIG. 1 has the advantage that the entire plasma ring can be varied by varying the magnetic field. It becomes greater or lesser according to the polarity of the magnet 17.

FIGS. 6 to 11 show different experimental results which can be achieved with the described cathode 1, in comparison with targets which were sputtered with a cathode having displaceable permanent magnets.

FIG. 6 and 7 show the ablation profiles for copper targets, using different sets of permanent magnets in sputtering cathodes in accordance with the invention.

FIG. 8 shows an ablation profile for a copper target which was sputtered with a conventional magnet set and lifting system.

Figure 9:
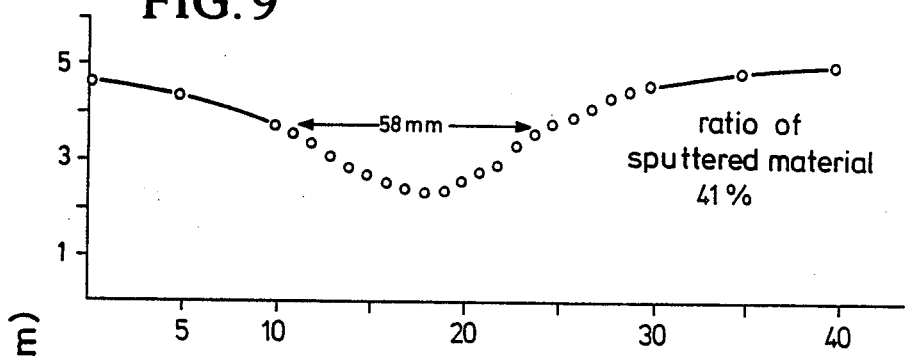
Figure 10:
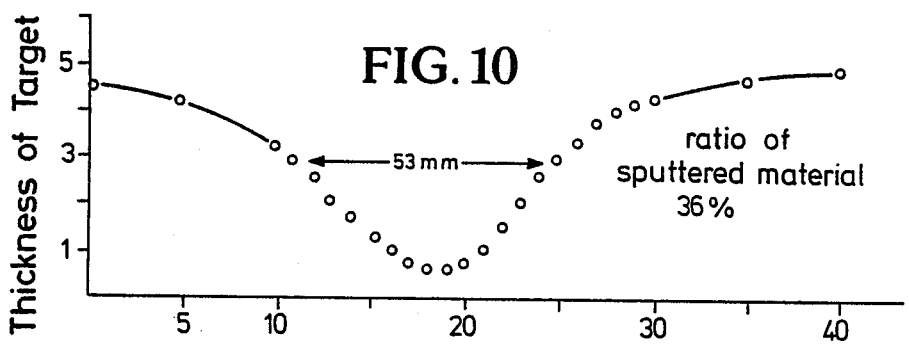
Figure 11:
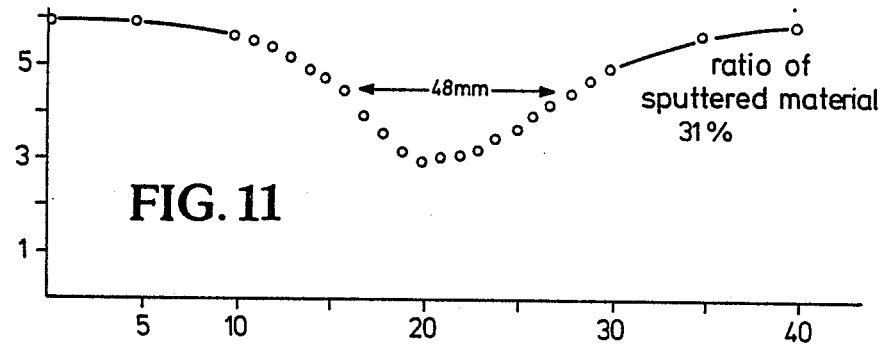

FIGS. 9 to 11 show the profiles for aluminum targets.

FIGS. 9 and 10 show how the sputtering pit varies during the performance of the experiment in sputtering cathodes in accordance with the invention.

FIG. 11 represents a profile of an aluminum target which was sputtered with a conventional magnet set and lifting system.

From the results of the experiments it can be seen that the sputtering pits become broader when the electromagnet is used, and the target utilization increases by about 8 to 10% in comparison to targets which are sputtered with a lifting system. It is clear that the described cathode in conjunction with the magnet lifting system permits still better results.

In the embodiment of the sputtering cathode 37 according to FIG. 4, the magnet yoke 33 is an elongated, pan-shaped or trough-shaped unit having in its middle section a rib-like core 35 around which the wire of the coil 38 is wound, so that the coil bundle is surrounded on one side by the parallel side walls and end walls 30 of the magnet yoke 33 and on the other hand by the bottom part 34 of the U-shaped base body 32. The permanent magnets 27, 28 and 29 are disposed on the rib-like core 35, which is integral with the bottom 36 of the yoke 33 and on the peripheral edge 39 of the pan-like magnet yoke 33. The magnetic tunnel 40 produced by the magnetic field configuration is indicated in broken lines above the "racetrack" that forms during the coating process. This tunnel 40 is in the form of a continuous endless racetrack matching the oval peripheral edge 39 of the magnet yoke 33 and extending over target 31.

We claim:

1. Sputtering cathode according to a magnetron system, comprising: a target of material to be sputtered, comprising at least one piece; and a magnet system disposed behind said target and having magnet units including permanent magnets of alternately different polarity by which at least one endless magnetic tunnel of arcuately curved lines of force is formed, said magnet units having poles which are remote from said target, said magnet system including a magnet yoke of soft magnetic material connecting said poles to one another, and said magnet system including an electromagnet, at least one of said permanent magnets being influenced by said electromagnet, in which sputtering cathode said electromagnet has a winding which has a core having an end facing said target and bearing a permanent magnet, in which sputtering cathode said magnet yoke bears said permanent magnets and is in the form of an elongated, substantially rectangular trough-shaped part, and which sputtering cathode includes a base body having said target and having a U-shaped cross section, said electromagnet being surrounded on one side by said troughshaped magnet yoke and on the other side by a bottom part of said base body and substantially filling the space formed by said yoke, said core, and said base body.

2. Sputtering cathode according to claim 1, in which said magnet yoke bears said permanent magnets and is annularly configured and said magnet yoke being a pot-like yoke for said electromagnet.

3. Sputtering cathode according to claim 1, in which said winding is wound into a hollow cylinder and disposed in said pot-like yoke as said electromagnet and which includes an insulating material body at least partially surrounding said electromagnet.

4. Sputtering cathode according to claim 1, in which said elongated, trough-shaped magnet yoke has two longitudinal walls and has a rib forming a coil core which extends parallel to said two longitudinal walls and is integral with a bottom of said yoke.

5. Sputtering cathode according to claim 1, which includes at least one of an amplifier and signal generator connected to said electromagnet and supplying said electromagnet with an alternating current whose amplitude, frequency and pulse shape are variable.

6. Sputtering cathode according to claim 1, in which said electromagnet supplies an electromagnetic field having a frequency set at 0.1 Hz to 10.0 Hz.

7. Sputtering cathode according to claim 1, in which said electromagnet supplies an electromagnetic field which changes with time as a rectangular function, wherein the ratio of the pulse lengths is selectable between 1:1 and 1:16.

* * * * *